(12) United States Patent
Boertjes et al.

(10) Patent No.: US 11,411,365 B2
(45) Date of Patent: Aug. 9, 2022

(54) SYSTEM-LEVEL OPTICAL AMPLIFIER EFFICIENCY PERFORMANCE METRIC

(71) Applicant: Ciena Corporation, Hanover, MD (US)

(72) Inventors: David W. Boertjes, Nepean (CA);
Damian Flannery, Ottawa (CA);
Kevan Jones, Ottawa (CA)

(73) Assignee: Ciena Corporation, Hanover, MD (US)

( * ) Notice: Subject to any disclaimer, the term of this patent is extended or adjusted under 35 U.S.C. 154(b) by 364 days.

(21) Appl. No.: 16/746,117

(22) Filed: Jan. 17, 2020

(65) Prior Publication Data
US 2021/0226408 A1    Jul. 22, 2021

(51) Int. Cl.
| | |
|---|---|
| *H01S 3/16* | (2006.01) |
| *H01S 3/094* | (2006.01) |
| *H04B 10/079* | (2013.01) |
| *H01S 3/067* | (2006.01) |
| *H01S 5/00* | (2006.01) |

(52) U.S. Cl.
CPC ...... *H01S 3/1608* (2013.01); *H01S 3/094003* (2013.01); *H01S 5/0021* (2013.01); *H04B 10/0797* (2013.01); *H01S 3/06704* (2013.01)

(58) Field of Classification Search
CPC .......... H01S 3/094003; H01S 3/06754; H01S 5/0021; H04B 10/0797
See application file for complete search history.

(56) References Cited

U.S. PATENT DOCUMENTS

| | | | |
|---|---|---|---|
| 5,374,973 A * | 12/1994 | Maxham | H01S 3/06754 359/341.4 |
| 5,539,570 A * | 7/1996 | Ushirozawa | H04B 10/2912 359/341.44 |
| 5,822,094 A | 10/1998 | O'Sullivan et al. | |

(Continued)

FOREIGN PATENT DOCUMENTS

EP    3 512 124 A1    7/2019

OTHER PUBLICATIONS

Christian Merkle, Degradation Model for Erbium-Doped Fiber Amplifiers to Reduce Network Downtime, 2010, p. 198-208, IFIP International Federation for Information Processing 2010.

(Continued)

*Primary Examiner* — Eric L Bolda
(74) *Attorney, Agent, or Firm* — Clements Bernard Baratta; Lawrence A. Baratta, Jr.; Christopher L. Bernard

(57) ABSTRACT

Systems and methods for a system-level Erbium-Doped Fiber Amplifier (EDFA) optical amplifier efficiency metric. The efficiency metric is a single metric that summarizes optical amplifier behavior and has a predictable behavior over various different optical amplifier settings. Specifically, the efficiency metric is simple and elegant. The simplicity is based on the fact the efficiency metric is determined from available data in an optical amplifier, not requiring external monitoring equipment, dithering, etc. The elegance is based on the fact the efficiency metric covers different optical amplifier settings, multiple pumps, etc. and is shown to reflect degradation with these differences in real-world sys- (Continued)

tems accurately. Specifically, the efficiency metric is designed to reflect health in a multiple pump optical amplifier, providing a single value that represents the total pump currents across all of the multiple pumps.

18 Claims, 6 Drawing Sheets

(56) References Cited

U.S. PATENT DOCUMENTS

| | | | |
|---|---|---|---|
| 6,064,501 A | 5/2000 | Roberts et al. | |
| 6,583,926 B1 * | 6/2003 | Wu .................... | H04B 10/2931 |
| | | | 372/38.07 |
| 7,379,234 B2 | 5/2008 | Rapp | |
| 2008/0285016 A1 * | 11/2008 | Eiselt ................. | H04B 10/2942 |
| | | | 356/73.1 |
| 2009/0192735 A1 * | 7/2009 | Horiuchi ............. | H01S 5/0021 |
| | | | 702/58 |

OTHER PUBLICATIONS

May 17, 2021, International Search Report and Written Opinion issued for International Patent Application No. PCT/US2021/013028.

* cited by examiner

SYSTEM-LEVEL OPTICAL AMPLIFIER EFFICIENCY PERFORMANCE METRIC

FIELD OF THE DISCLOSURE

The present disclosure generally relates to optical amplifiers. More particularly, the present disclosure relates to systems and methods for a system-level optical amplifier efficiency metric, such as for an Erbium-Doped Fiber Amplifier (EDFA).

BACKGROUND OF THE DISCLOSURE

Optical amplifiers are a key enabler for optical networks. Optical amplifiers amplify optical signals directly, without the need for conversion to an electrical signal. Examples of optical amplifiers include EDFAs, Raman amplifiers, and the like. Generally, optical amplifiers include multiple pump lasers which excite doped fiber, as is the case with EDFAs, or regular optical fiber, as is the case with Raman amplifiers. Optical amplifiers can support a range of wavelengths, such as the C-band (e.g., about 1530 nm to 1565 nm), the L-band (e.g., about 1565 nm to 1625 nm) with various optical channels, and the like. That is, an optical amplifier can support a significant amount of data traffic, such as hundreds of gigabits to multiple terabits. As such, it is critical to monitor the health of an in-service optical amplifier, such as for protection switching, for proactive maintenance, etc.

There has been significant work in developing metrics for monitoring optical amplifier health. For example, one technique includes the use of a laser pump current as a metric for indicating EDFA health. However, such approaches have significant limitations. First, optical amplifiers can include multiple pumps leading to problems in how to combine different pump currents into something meaningful. A further complication is that, for performance reasons, some selection of pumps may be run at much higher currents than others and the proportionality may change depending on the operating point of the amplifier. Also, the normal operating range of pump currents is very large. The pump currents are somewhat proportional to output power which can change over 10's of dBs (e.g., 1 channel to 96 channels can be 19 dB of change). Further pump currents depend on input power, output power, gain target, tilt settings, etc. Finally, the change in pump current may not be monotonic. One example of how this can happen is through the normal action of adding and deleting channels in an optical network to accommodate changing traffic demands. In terms of the EDFA, adding channels may increase pump current while deleting channels may decrease pump current. This makes the trend analysis difficult—what is normal change and what is indicative of precipitous failure? FIG. 1 is a graph illustrating the normal range of pump current. Because the normal range of pump current is so large, the changes in pump current due to amplifier degradation are indistinguishable from normal operation. Thus, the pump current does not serve well as a metric of EDFA health.

Another metric is whether an EDFA is able to achieve its specified maximum output power. However, in many system conditions, the amplifiers are not required to output the maximum power, so any internal degradation would not be evident using this metric. The EDFA may have degraded in noise figure and may, therefore, be compromising overall system performance which would go undetected, and even if it were detected, it would not be evident which EDFA in a cascade is the problematic one.

U.S. Pat. No. 5,822,094 to O'Sullivan et al., issued Oct. 13, 1998, and entitled "Self-stimulation signal detection in an optical transmission system," the contents of which are incorporated herein by reference, describes various techniques for monitoring optical amplifier performance utilizing dithering on signals and measuring the energy in transmitted and received dithers. This approach explicitly requires dithering.

U.S. Pat. No. 6,064,501 to Roberts et al., issued May 16, 2000, and entitled "Method of determining optical amplifier failures," the contents of which are incorporated herein by reference, describes various techniques for measuring a performance parameter of an optical amplifier. Specifically, Roberts et al. define a Figure of Merit (FOM) which is a health metric that can be monitored to indicate degradation of amplifier health. Deterioration is determined by a difference between a current FOM and a start of life FOM. The FOM is determined utilizing various measurements that are based on a pump back facet monitor, flowrates determined by Amplifier Stimulated Emission (ASE) power values, photon flowrates at specific wavelengths, etc. Drawbacks of this approach involve its complexity, expense such as in terms of the required measurement, external monitoring devices such as the pump back facet monitor, etc.

Merkle, Christian, "Degradation model for erbium-doped fiber amplifiers to reduce network downtime." *Meeting of the European Network of Universities and Companies in Information and Communication Engineering.* Springer, Berlin, Heidelberg, 2010, the contents of which are incorporated herein by reference, provides background and motivation related to the present disclosure. Merkle assumes a common misconception that pump current is constant for a constant gain, stating "[t]he basic concept of the algorithm is to calculate the pump diode current that would be needed to create the measured gain." This is only true for very controlled conditions, and not generally true for the wide range of conditions that amplifiers see in the field in real deployments. For example, Merkle further states "[d]ue to aging effects of the amplifier, the pump power of the amplifier has to be increased to obtain a constant gain." The assumption here is the only mechanism that would cause the pump current to need to be increased is that of aging. In a real system, i.e., one deployed and operating in the field under actual physical conditions and carrying traffic, the addition of more channels, changes in upstream loss, changes in control parameters, etc. all contribute to changes in pump current that have nothing to do with aging or impending failure.

Merkle further describes the "max pump current" being reached as an indicator of failure. This is only true in a single pump amplifier. In multi-pump designs, there are pump control algorithms that prefer to run some pumps very high, near or at their maximum current (power), in order to improve the noise performance of the amplifier.

As optical capacity increases, a single EDFA optical amplifier module can include multiple Terabits or more of capacity. As such, a single module failure can cause a significant loss of bandwidth. There is a need to provide a proactive metric that can be continually monitored to indicate health.

BRIEF SUMMARY OF THE DISCLOSURE

The present disclosure relates to systems and methods for a system-level optical amplifier efficiency metric, such as for an Erbium-Doped Fiber Amplifier (EDFA). The efficiency metric is a single metric that summarizes optical amplifier behavior and has a predictable behavior over various different optical amplifier settings and operation conditions. Specifically, the efficiency metric is simple and elegant. The simplicity is based on the fact the efficiency metric is determined from available data in an optical amplifier, not requiring external monitoring equipment, dithering, etc. The elegance is based on the fact the efficiency metric covers different optical amplifier settings, operating conditions, multiple pumps, etc. and is shown to reflect degradation with these differences in real-world systems accurately. Specifically, the efficiency metric is designed to reflect health in a multiple pump optical amplifier, providing a single value that represents the total pump currents across all of the multiple pumps.

The present disclosure can be implemented as a method, as instructions stored in a non-transitory computer-readable medium, and in an optical amplifier. In an embodiment, the steps for the method or the instructions include obtaining data from an Erbium-Doped Fiber Amplifier (EDFA) optical amplifier having a plurality of pumps, wherein the data includes a representative optical power in the EDFA optical amplifier and a pump metric representative of a state of the plurality of pumps; determining an efficiency metric based on the representative optical power and the pump metric representative of the state of the plurality of pumps; determining a degradation in operation of the EDFA optical amplifier based on the efficiency metric; and causing one or more actions based on a determination of the degradation.

The steps can further include determining the degradation based on one of i) the efficiency metric reaching a threshold and ii) values of the efficiency metric over time having a negative trend. The one or more actions can include any of an alert via a Network Management System (NMS) for proactive maintenance, and a protection switch to another path in a network that does not include the EDFA optical amplifier. The data can include outputs of a plurality of power monitors and calibration data in memory on the EDFA optical amplifier. The representative optical power can be a linear combination of a selection of a plurality of total input power, total output power, signal output power, and signal input power, and the pump metric can be a linear combination of a selection of a plurality of pump optical powers, pump drive currents, back facet monitor powers, back facet monitor currents, pump monitor powers, and pump monitor currents.

In a first embodiment, the representative optical power is $P_{out}-P_{in}$ where $P_{out}$ can be the output power of the EDFA optical amplifier including Amplified Stimulated Emission (ASE) and $P_{in}$ is the input power to the EDFA optical amplifier including ASE, the pump metric can be $\Sigma_i(I_i-I_{th,i})$ where i is an integer the counts over all of the plurality of pumps, $I_i$ is the current of pump I, and $I_{th,i}$ is the threshold current of pump I, and the efficiency metric can equal to $$\frac{P_{out}-P_{in}}{\Sigma_i(I_i-I_{th,i})}.$$

In a second embodiment, the representative optical power can be $GP_{in}$ where G is the signal gain of the EDFA optical amplifier and $P_{in}$ is the input power to the EDFA optical amplifier including ASE, the pump metric can be $\Sigma_i(I_i-I_{th,i})$ where i is an integer the counts over all of the plurality of pumps, $I_i$ is the current of pump I, and $I_{th,i}$ is the threshold current of pump I, and the efficiency metric can be equal to $$\eta_{eff}=\frac{GP_{in}}{\Sigma_i(I_i-I_{th,i})}.$$

In a third embodiment, the representative optical power can be $GP_{in}$ where G is the signal gain of the EDFA optical amplifier and $P_{in}$ is the input power to the EDFA optical amplifier including ASE, the pump metric can be $\Sigma_i(P_i)$ where i is an integer the counts over all of the plurality of pumps, and $P_i$ is the optical power of pump i, and the efficiency metric can be equal to $$\eta_{eff}=\frac{GP_{in}}{\Sigma_i(P_i)}.$$

In a fourth embodiment, the representative optical power can utilize a transmission coefficient of a Variable Optical Attenuator (VOA) associated with the EDFA optical amplifier. In a fifth embodiment, the representative optical power can be $\int \delta(f)\rho_{EDFA}df$, where $f$ is the frequency to be integrated over the full band of the EDFA optical amplifier, $\delta(f)$ is the normalization factor of efficiency as a function of frequency, and $\rho_{EDFA}$ is the power spectral density of a representative power metric in the EDFA optical amplifier.

In another embodiment, an Erbium-Doped Fiber Amplifier (EDFA) optical amplifier includes doped fiber; a plurality of pumps connected to the doped fiber; a plurality of power monitors; and a controller configured to obtain data from the plurality of pumps and the plurality of power monitors, wherein the data includes a representative optical power in the EDFA optical amplifier and a pump metric representative of a state of the plurality of pumps, determine an efficiency metric based on the representative optical power and the pump metric representative of the state of the plurality of pumps, determine a degradation in operation of the EDFA optical amplifier based on the efficiency metric, and cause one or more actions based on a determination of the degradation.

The controller can be further configured to determine the degradation based on one of i) the efficiency metric reaching a threshold and ii) values of the efficiency metric over time having a negative trend. The one or more actions can include any of an alert via a Network Management System (NMS) for proactive maintenance, and a protection switch to another path in a network that does not include the EDFA optical amplifier. The data can include calibration data in memory on the EDFA optical amplifier. The representative optical power can be a linear combination of a selection of a plurality of total input power, total output power, signal output power, and signal input power, and the pump metric can be a linear combination of a selection of a plurality of pump optical powers, pump drive currents, back facet monitor powers, back facet monitor currents, pump monitor powers, and pump monitor currents.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
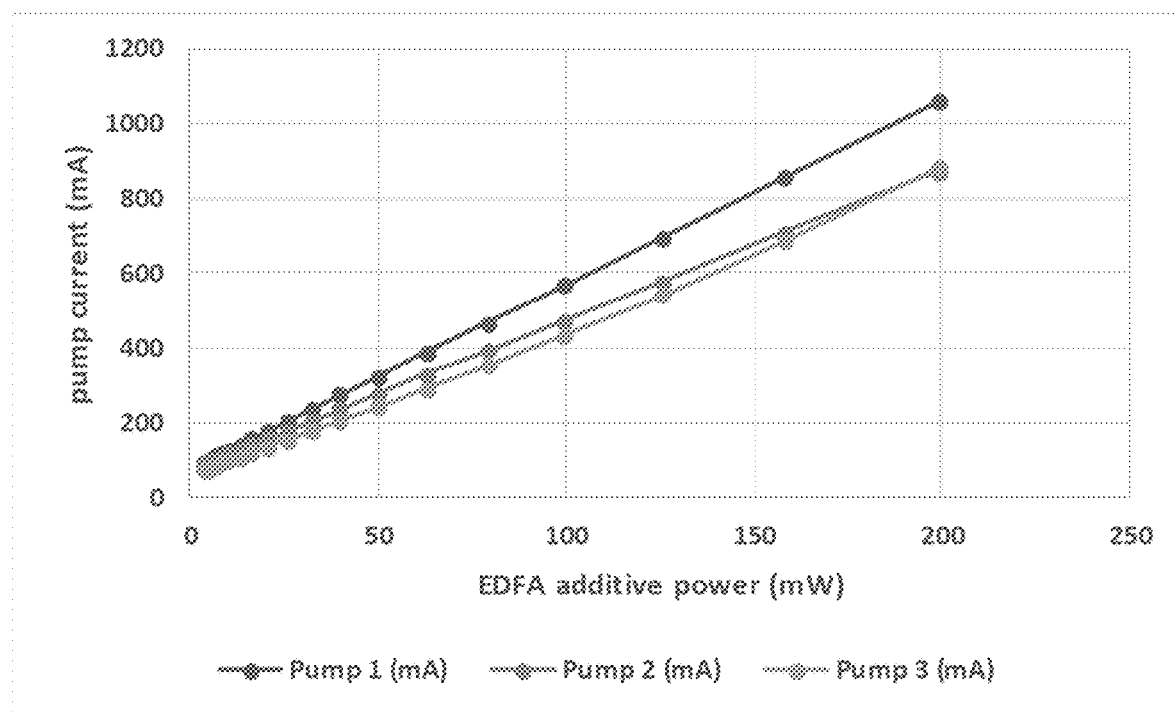
FIG. 1 is a graph illustrating the problem of pump current in an EDFA.

Again, the present disclosure relates to systems and methods for a system-level optical amplifier efficiency metric, such as for an Erbium-Doped Fiber Amplifier (EDFA). The efficiency metric is a single metric that summarizes optical amplifier behavior and has a predictable behavior over various different optical amplifier settings and operating conditions. Specifically, the efficiency metric is simple and elegant. The simplicity is based on the fact the efficiency metric is determined from available data in an optical amplifier, not requiring external monitoring equipment, dithering, etc. The elegance is based on the fact the efficiency metric covers different optical amplifier settings, operating conditions, multiple pumps, etc. and is shown to reflect degradation with these differences in real-world systems accurately. Specifically, the efficiency metric is designed to reflect health in a multiple pump optical amplifier, providing a single value that represents the total pump currents across all of the multiple pumps.

The current trend is for optical network equipment to provide additional value to network operators. For example, operating the network at a low Signal-to-Noise Ratio (SNR) margin is seen as one of the ways to get more capacity or reach, and have an overall more cost-effective offering. As a result, proactive network health prediction is more important than ever. In the past, systems were operated with excess SNR margin for safety. As operators seek to exploit this excess margin, there is less margin for safety and thus a need to proactively monitor for system degradation. One example of utilizing excess SNR for more capacity or reach is described in U.S. Pat. No. 10,148,348 to Swinkels et al., issued Dec. 4, 2018, and entitled "Systems and methods to increase capacity in optical networks based on excess margin," the contents of which are incorporated herein by reference. Also, systems may also include protection (such as 1+1 or 1:1 protection in Synchronous Optical Network (SONET) or Optical Transport Network (OTN), redundant link capacity in Internet Protocol (IP)/Ethernet, etc.), at layers above the optical layer. If one can increase the optical layer availability (reliability) by predicting failures at the optical layer, one can reduce the amount of redundant capacity which results in a more cost-effective offering.

As part of such proactive monitoring, centralized control and analytics solutions such as Ciena Corporation's Blue Planet Analytics use constant monitoring and trending analysis to implement applications such as a Network Health Predictor aimed at this very goal. This disclosure provides a more meaningful metric, which can be used with this type of app for the prediction of the health of EDFAs than is available today. The goal of such a metric is to detect degradation of an optical amplifier in advance of any failures or impacts on live traffic. With advanced warning of degradations, it is possible to implement proactive maintenance, thereby increasing availability and reliability at the optical layer.

Figure 2:
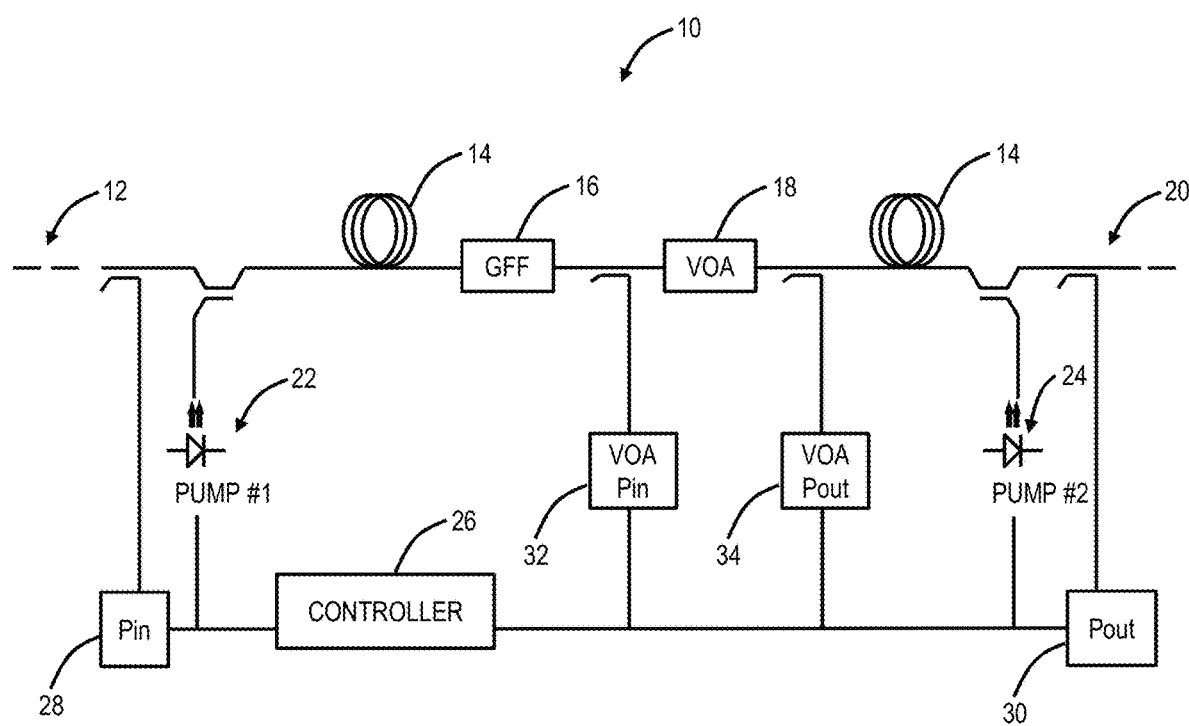
FIG. 2 is a block diagram of an EDFA optical amplifier.

FIG. 2 is a block diagram of an EDFA optical amplifier 10. The optical amplifier 10 includes an input 12, doped fiber 14, a Gain Flattening Filter (GFF) 16, a Variable Optical Attenuator (VOA) 18, and an output 20. The optical amplifier 10 further includes multiple pumps 22, 24 that are configured to provide a pump laser to excite the doped fiber 14. For example, the doped fiber 14 can be doped with Erbium, and the pumps 22, 24 can be at or around 980 nm, 1480 nm, etc. The pumps 22, 24 have a pump laser current, $I_i$ is the current of pump i. The values of the pump laser current can be provided to a controller 26. The optical amplifier 10 also includes a power monitor 28 that detects input power, $P_{in}$, a power monitor 30 that detects output power, $P_{out}$, a power monitor 32 that detects input power to the VOA 18, VOA $P_{in}$, and a power monitor 34 that detects output power from the VOA 18, VOA $P_{out}$. Of note, the optical amplifier 10 includes various couplers and taps to connect the various components. Also, it should be appreciated by those of ordinary skill in the art that FIG. 2 depicts the optical amplifier 10 in an oversimplified manner, and a practical embodiment may include additional components and suitably configured processing logic to support known or conventional operating features that are not described in detail herein. For example, the optical amplifier 10 can include multiple stages of doped fiber 14, more pumps 22, 24, etc. Operationally, the optical amplifier 10 is configured to amplifier optical signals at the input 12 and provide the amplified optical signals at the output 20.

The controller 26 is a processing device and is communicatively coupled to various components in the optical amplifier 10 as well as configured to provide an output, such as to a Network Management System (NMS), Element Management System (EMS), Software Defined Networking (SDN) controller, analytics engine, etc. Generally, the controller 26 can include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, the controller is a hardware device, optionally with software, firmware, and a combination thereof, and can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

The present disclosure allows for the simplification of the issues of existing solutions by summarizing the EDFA optical amplifier 10 behavior into a single metric that has a predictable behavior over many different settings of the EDFA optical amplifier 10.

The metric proposed is an effective pump efficiency, $\eta_{eff}$ calculated as follows:

$$\eta_{eff} = \frac{P_{EDFA}}{A_{pump}} \quad (1)$$

where $P_{EDFA}$ is a representative optical power in the EDFA optical amplifier 10, and $A_{pump}$ is a chosen metric representative of the state of the pumps 22, 24 in the EDFA optical amplifier 10.

This metric works well as a monitor of the health of the optical amplifier 10 as it is a generalization of the law of conservation of power. The generalization makes the metric simpler by allowing a relaxation of the normal all-inclusive nature of the law of conservation, and by allowing a mixture of inputs which may not have the same units. It allows the designer of the metric to choose the available measurements in the optical amplifier 10 while not worrying about the conversion factors, e.g., current in mA to power in mW, or minor contributors such as additive ASE which can be complex and expensive to measure. That is, the metric is based on available measurements in the optical amplifier 10, in their current units. There is no need for excess monitoring equipment or the need to perform complex measurements or calculations.

As a result, the EDFA optical power metric in the numerator of the expression can be any function, usually a linear combination, of a selection of total input power, total output power, signal output power, signal input power, etc. Those of ordinary skill in the art will appreciate these values are available from the power monitor 28 that detects input power, $P_{in}$, and the power monitor 30 that detects output power, $P_{out}$. That is, the power monitors 28, 30 are configured to provide both total power and individual signal power values. Also, those of ordinary skill in the art will appreciate practically all implementations of EDFA optical amplifiers 10 include these power monitors 28, 30.

The pump metric in the denominator of the expression can be any function, usually a linear combination of a selection of pump optical powers, pump drive currents, back facet monitor powers, back facet monitor currents, pump monitor powers, pump monitor currents, etc. It should be noted that the metric thus attained may have different units in different embodiments. For the purposes of detecting degradation or trend analysis, this has no effect. Those of ordinary skill in the art will recognize the pumps 22, 24 can directly provide various readings to the controller 26, such as pump drive currents, etc.

First Embodiment

In a first embodiment, the metrics $P_{EDFA}$ and $A_{pump}$ can be defined in terms of easily obtainable parameters of the EDFA optical amplifier 10, namely:

$$\eta_{eff} = \frac{P_{out} - P_{in}}{\sum_i (I_i - I_{th,i})} \quad (2)$$

where $P_{out}$ is the output power of the EDFA optical amplifier 10 (including ASE), $P_{in}$ is the input power to the EDFA optical amplifier 10 (including ASE), i is an integer the counts over all pumps in the EDFA optical amplifier 10, $I_i$ is the current of pump I, and $I_{th,i}$ is the threshold current of pump i.

The efficiency in this embodiment in equation (2) has units of mW/mA.

Advantageously, the various values used to determine the metric in equation (2) are readily available in the EDFA optical amplifier 10, without the need for additional monitoring equipment, dithering, etc. $P_{out}$ and $P_{in}$ are available from the power monitors 28, 30. The currents $I_i$ of pump i can be read by or provided to the controller 26 from the corresponding pumps 22, 24.

The threshold current, $I_{th,i}$, can be taken from the individual pump 22, 24 characteristics, the specifications for the pumps 22, 24, or can be measured empirically during the calibration and manufacturing process. It is also not necessary to determine the threshold currents individually in the case of empirical measurement since the sum in the denominator can be distributed across the two currents in the sum. By doing so, there is a single constant that represents the total threshold current across all pumps. Also, the characteristics, measurements, and/or specifications can be provided in local memory on the EDFA optical amplifier 10, such as in the controller 26, in memory, firmware, etc. As such, these values can be read by or are in the controller 26, for use in the equation (2) and other equations described herein.

Figure 3:
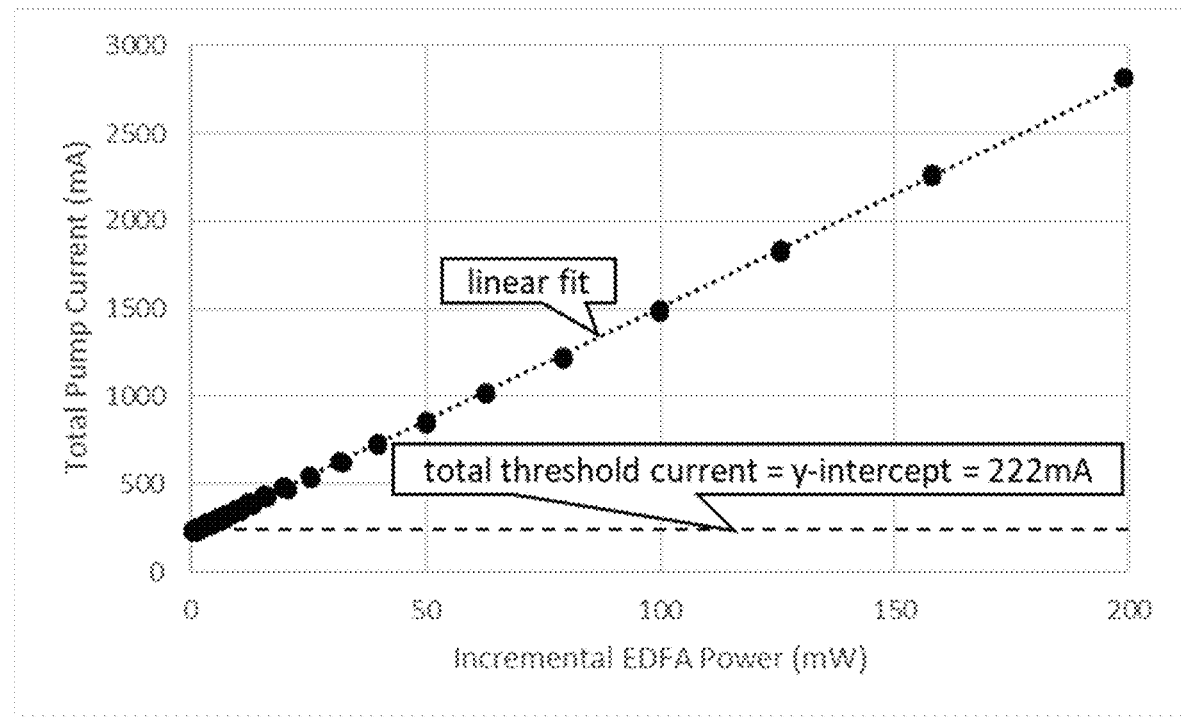
FIG. 3 is a graph describing one way to determine the total threshold current of an EDFA optical amplifier.

FIG. 3 illustrates one way to determine the total threshold current. In this approach, the optical amplifier 10 is controlled to a specific power setting, in this case, the additive EDFA power. For each power setting, the total pump current is measured. One can then plot a graph similar to FIG. 3 where the x-axis is the additive EDFA power and y-axis is the total pump current. A linear trend line can then be plotted through the data where the y-intercept of this line gives the total threshold current, which in this example would be 222 mA.

Figure 4:
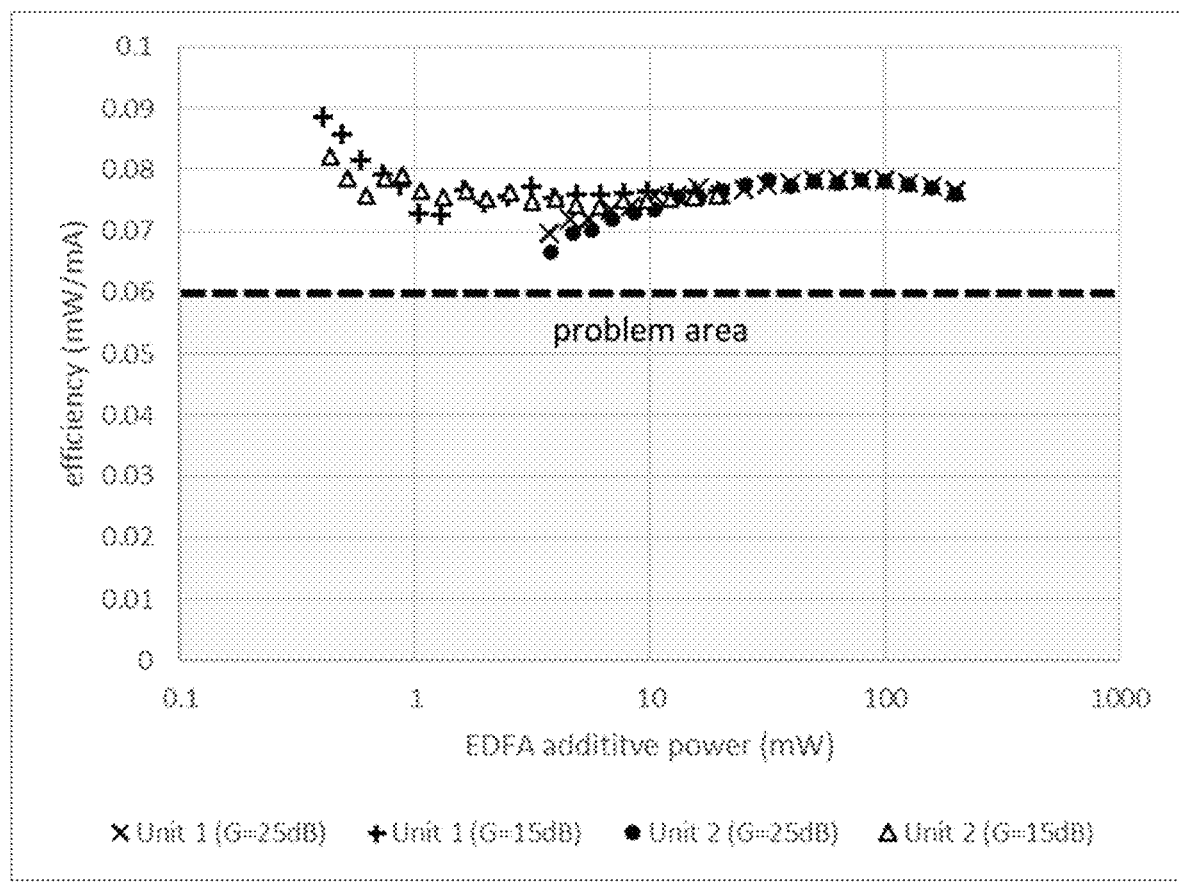
FIG. 4 is a graph of the metric from the first embodiment measured on different EDFA optical amplifiers.

FIG. 4 is a graph of the metric from the first embodiment measured on different EDFA optical amplifiers 10. The graph shows data points measured from 2 different constant gain controlled EDFA modules, Unit 1 and Unit 2. Each of these amplifiers is slightly more complex than the example optical amplifier 10 shown in FIG. 2, and has multiple Erbium doped fiber stages, a mid-stage VOA, gain flattening filter, and 3 pump lasers. The gain control in the module uses feedback from $P_{out}$ and $P_{in}$ available from the power monitors to calculate the Gain and adjusts the pumps accordingly to achieve the gain while minimizing the noise contribution of the module. Each module is operated at two different gain settings, 15 dB and 25 dB. The measurements of EDFA additive power and total pump current are taken over a range of input powers for each gain setting. From these, the efficiency metric from equation (2) is calculated and plotted against the EDFA additive power. This results in the four series of points shown in the graph. The left-most point in each series is the lowest operating power condition and the right-most point is the highest, each point in between being steps in optical power.

The result of this simple metric is a relatively constant efficiency metric which is independent of operation conditions and design details of the amplifier, e.g., number of pumps, number of doped fiber 14 stages, connectivity of the components, inclusion of GFF, VOAs, etc. These curves represent the normal operation of these amplifiers, such that if the efficiency were to drop it would be indicative of some issue internal to the module. Here, the metric (in mW/mA) indicates problems below 0.06.

Second Embodiment

In another embodiment, the metrics $P_{EDFA}$ and $A_{pump}$ can be defined in terms of different parameters of the EDFA:

$$\eta_{eff} = \frac{GP_{in}}{\sum_i (I_i - I_{th,i})} \quad (3)$$

where G is the signal gain of the EDFA optical amplifier 10, $P_{in}$ is the input power to the EDFA optical amplifier 10 (including ASE), i is an integer the counts over all pumps in the EDFA optical amplifier 10, $I_i$ is the current of pump i, and $I_{th,i}$ is the threshold current of pump i.

The efficiency in equation (3) of this embodiment has units of mW/mA. The threshold currents can be in the same way as the previous embodiment.

Figure 5:
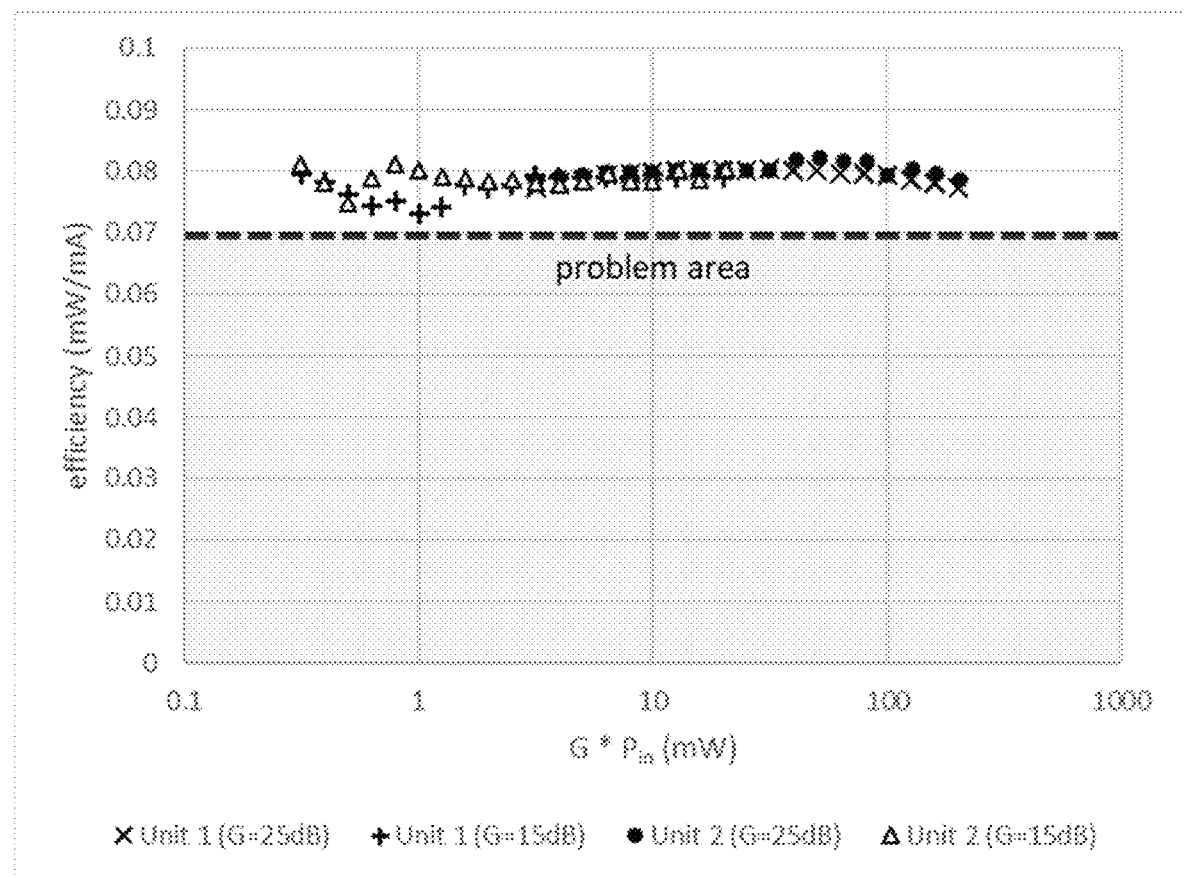
FIG. 5 is a graph of the metric from the second embodiment measured on different EDFA optical amplifiers.

FIG. 5 is a graph of the metric from the second embodiment measured on different EDFA optical amplifiers 10. The graph shows data points measured from 2 different constant gain controlled EDFA modules, Unit 1 and Unit 2. Each of these amplifiers is slightly more complex than the example shown in FIG. 2, and has multiple Erbium doped fiber stages, a mid-stage VOA, gain flattening filter, and 3 pump lasers. The gain control in the module uses feedback from $P_{out}$ and $P_{in}$ available from the power monitors to calculate the Gain and adjusts the pumps accordingly to achieve the gain while minimizing the noise contribution of the module. Each module is operated at two different gain settings, 15 dB and 25 dB. The measurements of $G*P_{in}$ and total pump current are taken over a range of input powers for each gain setting. From these, the efficiency metric from equation (3) is calculated and plotted against $G*P_{in}$. This results in the four series of points shown in the graph. The left-most point in each series is the lowest operating power condition and the right-most point is the highest, each point in between being steps in optical power.

The result of this simple metric is a relatively constant efficiency metric which is independent of operation conditions and design details of the amplifier. These curves represent the normal operation of these amplifiers, such that if the efficiency were to drop it would be indicative of some issue internal to the module. Here, the metric (in mW/mA) indicates problems below 0.07.

Third Embodiment

In another embodiment, it is contemplated to use the optical power of the pumps directly either through calibrated monitor points, like back facet monitors or through knowledge of the L-I curves of the pumps themselves:

$$\eta_{eff} = \frac{GP_{in}}{\sum_i (P_i)} \quad (4)$$

where G is the signal gain of the EDFA optical amplifier 10, $P_{in}$ is the input power to the EDFA optical amplifier 10 (including ASE), i is an integer the counts over all pumps in the EDFA optical amplifier 10, $P_i$ is the optical power of pump i.

The efficiency in this embodiment is unitless (mW/mW).

Equation (4) works nicely for amplifiers 10 operating with a constant spectral loading over a wide range of input powers. This is the case for many systems that employ channel loading technologies, such as loading the band with ASE and then substituting noise power for channel power in a specific part of the spectrum using a Wavelength Selective Switch (WSS).

Fourth Embodiment

More complex formulations are also contemplated to take into consideration other factors which can change the efficiency. One such modification can help take into consideration the additional internal loss of the VOA 18 used in most gain flattened EDFA optical amplifiers 10:

$$\eta_{eff} = \frac{T_{VOA} P_{EDFA}}{A_{pump}} \quad (5)$$

where $T_{VOA}$ is a function of the transmission coefficient of the VOA 18. The factor $T_{VOA}$ is not strictly the transmission coefficient of the VOA 18 but represents the change in the pump to additional power efficiency due to losing some fraction of the optical power in the mid-stage element. This factor can be simulated or measured empirically during the calibration of the amplifier 10.

Fifth Embodiment

In the case that the efficiency of the amplifier 10 is a strong function of frequency and the spectral occupancy of the input signal is expected to change over time, one can change the efficiency calculation to include an integration of a normalization factor (or a weighted sum in the case of fixed channel systems) as follows:

$$\eta_{eff} = \frac{\int \delta(f) \rho_{EDFA} df}{A_{pump}} \quad (6)$$

where $f$ is the frequency to be integrated over the full band of the EDFA optical amplifier 10, $\delta(f)$ is the normalization factor of efficiency as a function of frequency, and $\rho_{EDFA}$ is the power spectral density of the representative power metric in the EDFA optical amplifier 10.

Advantages

The advantage of this metric over the usual pump current metric is the relatively constant value it maintains over several decades of change in the optical power of the EDFA optical amplifier 10. The effective efficiency represents the performance of the EDFA optical amplifier 10, therefore changes in the effective efficiency are distinct from normal changes in the operating conditions of the EDFA optical amplifier 10. The mechanisms that would cause the effective efficiency to be degraded include:

Additional loss internal to the EDFA optical amplifier 10 due to component aging or failure, Pump laser coupling efficiency degradation, e.g., misalignment, Pump laser aging causing a change in the threshold current, The mechanical strain on fiber or other optical components due to aging or damage or thermal cycling, etc., Package compromised by water or other contaminants and the like.

These effects compromise the EDFA optical amplifier's 10 ability to achieve its specified output power or noise performance or both.

EDFA Optical Amplifier Health Monitoring Process

Figure 6:
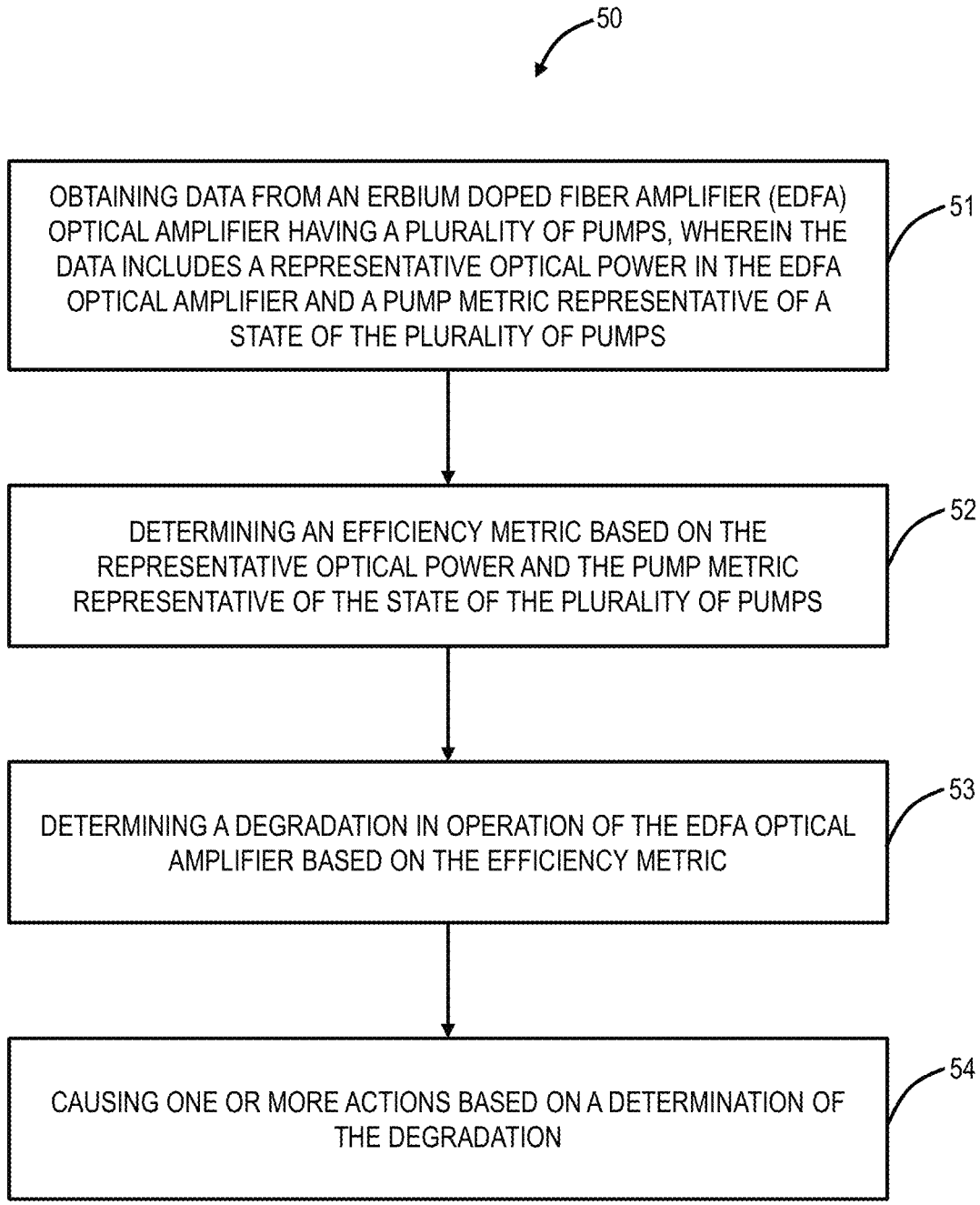
FIG. 6 is a flowchart of an EDFA optical amplifier health monitoring process.

FIG. 6 is a flowchart of an EDFA optical amplifier health monitoring process 50. The process 50 can be implemented as a method, implemented in the controller 26 of the EDFA optical amplifier 10, or embodied as instructions stored in a non-transitory computer-readable medium. The process 50 includes obtaining data from an Erbium-Doped Fiber Amplifier (EDFA) optical amplifier having a plurality of pumps, wherein the data includes a representative optical power in the EDFA optical amplifier and a pump metric representative of a state of the plurality of pumps (step 51); determining an efficiency metric based on the representative optical power and the pump metric representative of the state of the plurality of pumps (step 52); determining a degradation in operation of the EDFA optical amplifier based on the efficiency metric (step 53); and causing one or more actions based on a determination of the degradation (step 54).

The process 50 can further include determining the degradation based on one of i) the efficiency metric reaching a threshold and ii) values of the efficiency metric over time having a negative trend. One approach to detect the degradation is to set a threshold for operation. If the effective efficiency drops below a specified threshold value, the optical amplifier is operating in a regime indicative of failure. The severity of this prediction can be judged on other parameters, such as whether the amplifier is able to achieve its output power target or whether it is generating additional noise. A second, less restrictive, approach would be to gather the statistic over time and perform a trending analysis on it. Any significant downward trend in the effective efficiency would be indicative of a potential failure.

The one or more actions can include any of an alert via a Network Management System (NMS) for proactive maintenance, and a protection switch to another path in a network that does not include the EDFA optical amplifier. For example, the proactive maintenance may include replacing the EDFA optical amplifier, such as during a maintenance window.

The data can include outputs of a plurality of power monitors and calibration data in memory on the EDFA optical amplifier. The representative optical power can be a linear combination of a selection of a plurality of total input power, total output power, signal output power, and signal input power, and the pump metric can be a linear combination of a selection of a plurality of pump optical powers, pump drive currents, back facet monitor powers, back facet monitor currents, pump monitor powers, and pump monitor currents.

The representative optical power can be $P_{out}-P_{in}$ where $P_{out}$ is the output power of the EDFA optical amplifier including Amplified Stimulated Emission (ASE) and $P_{in}$ is the input power to the EDFA optical amplifier including ASE, wherein the pump metric can be $\Sigma_i(I_i-I_{th,i})$ where i is an integer the counts over all of the plurality of pumps, $I_i$ is the current of pump I, and $I_{th,i}$ is the threshold current of pump I, and wherein the efficiency metric can be equal to $$\frac{P_{out}-P_{in}}{\Sigma_i(I_i-I_{th,i})}.$$

The representative optical power can be $GP_{in}$ where G is the signal gain of the EDFA optical amplifier and $P_{in}$ is the input power to the EDFA optical amplifier including ASE, wherein the pump metric can be $\Sigma_i(I_i-I_{th,i})$ where i is an integer the counts over all of the plurality of pumps, is the current of pump I, and $I_{th,i}$ is the threshold current of pump I, and wherein the efficiency metric can be equal to $$\eta_{eff}=\frac{GP_{in}}{\Sigma_i(I_i-I_{th,i})}.$$

The representative optical power can be $GP_{in}$ where G is the signal gain of the EDFA optical amplifier and $P_{in}$ is the input power to the EDFA optical amplifier including ASE, wherein the pump metric can be $\Sigma_i(P_i)$ where i is an integer the counts over all of the plurality of pumps, and $P_i$ is the optical power of pump i, and wherein the efficiency metric can be equal to $$\eta_{eff}=\frac{GP_{in}}{\Sigma_i(P_i)}.$$

The representative optical power can utilize a transmission coefficient of a Variable Optical Attenuator (VOA) associated with the EDFA optical amplifier. The representative optical power can be $\int \delta(f)\rho_{EDFA}df$, where $f$ is the frequency to be integrated over the full band of the EDFA optical amplifier, $\delta(f)$ is the normalization factor of efficiency as a function of frequency, and $\rho_{EDFA}$ is the power spectral density of a representative power metric in the EDFA optical amplifier.

In another embodiment, an Erbium-Doped Fiber Amplifier (EDFA) optical amplifier includes doped fiber; a plurality of pumps connected to the doped fiber a plurality of power monitors; and a controller configured to obtain data from the plurality of pumps and the plurality of power monitors, wherein the data includes a representative optical power in the EDFA optical amplifier and a pump metric representative of a state of the plurality of pumps, determine an efficiency metric based on the representative optical power and the pump metric representative of the state of the plurality of pumps, determine a degradation in operation of the EDFA optical amplifier based on the efficiency metric, and cause one or more actions based on a determination of the degradation.

Network Monitoring and Analytics

The metrics described herein can be displayed such as via a User Interface (UI), such as via an NMS, EMS, SDN controller, etc. Such a UI may include current metrics, historical metrics, trends, etc. Further, the present disclosure can include charts displaying the metrics, historical metrics, trends, etc. for one or more optical amplifiers 10, as well as for an entire network population of optical amplifiers 10. Also, there can be alarms and/or warnings based on the metrics, and these can also be displayed, streaming, alerted, etc.

In addition to various UI displays for the metrics, the metrics can be stored and maintained over time for individual optical amplifiers 10, for different types of optical amplifiers 10, for entire population of optical amplifiers 10. These historical metrics can be used for deriving analytics related to ongoing operation and performance of the optical amplifiers 10. The present disclosure also contemplates use of data analytics and machine learning with the metrics to determine trends and predictions. Such analytics can provide valuable insights into the operation of the optical amplifiers 10, such as which designs are more reliable, etc.

Overall Network Reliability

As mentioned herein, multi-layer networks such as packet-optical networks include redundancy to support high availability. The redundancy generally includes excess capacity at the various layers (Layer 1—Time Division Multiplexing (TDM), Layers 2 or 3—packet, etc.). The excess capacity is generally reserved or preemptible. As such, this excess capacity is not exploited. Multi-layer networks all operate over an optical layer. With reliable data at the optical layer using the metrics described herein, it is possible to perform proactive maintenance in the optical layer, e.g., replacing optical amplifiers 10 before there are failures causing traffic impact. This generally increases the overall reliability of the optical layer. With an increase in the overall reliability of the optical layer, the multi-layer networks can be configured with less redundant capacity in the higher layers.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A non-transitory computer-readable medium having instructions stored thereon for programming a processor to perform steps of:
    obtaining data from an Erbium-Doped Fiber Amplifier (EDFA) optical amplifier having a plurality of pumps, wherein the data includes a representative optical power in the EDFA optical amplifier and a pump metric representative of a state of the plurality of pumps;
    determining an efficiency metric based on the representative optical power and the pump metric representative of the state of the plurality of pumps;
    determining a degradation in operation of the EDFA optical amplifier based on the efficiency metric; and
    causing one or more actions based on a determination of the degradation,
    wherein the representative optical power is $GP_{in}$ where G is the signal gain of the EDFA optical amplifier and $P_{in}$ is the input power to the EDFA optical amplifier including ASE,
    wherein the pump metric is $\Sigma_i(I_i - I_{th,i})$ where i is an integer the counts over all of the plurality of pumps $I_i$ is the current of pump I and $I_{th,i}$ is the threshold current of pump I, and
    wherein the efficiency metric is equal to $$\eta_{eff} = \frac{GP_{in}}{\Sigma_i(I_i - I_{th,i})}.$$

2. The non-transitory computer-readable medium of claim 1, wherein the instructions stored thereon further program the processor to perform steps of
    determining the degradation based on one of i) the efficiency metric reaching a threshold and ii) values of the efficiency metric over time having a negative trend.

3. The non-transitory computer-readable medium of claim 1, wherein the one or more actions include any of
    an alert via a Network Management System (NMS) for proactive maintenance, and
    a protection switch to another path in a network that does not include the EDFA optical amplifier.

4. The non-transitory computer-readable medium of claim 1, wherein the data includes outputs of a plurality of power monitors and calibration data in memory on the EDFA optical amplifier.

5. The non-transitory computer-readable medium of claim 1, wherein the representative optical power is a linear combination of a selection of a plurality of total input power, total output power, signal output power, and signal input power, and
    wherein the pump metric is a linear combination of a selection of a plurality of pump optical powers, pump drive currents, back facet monitor powers, back facet monitor currents, pump monitor powers, and pump monitor currents.

6. The non-transitory computer-readable medium of claim 1, wherein the representative optical power utilizes a transmission coefficient of a Variable Optical Attenuator (VOA) associated with the EDFA optical amplifier.

7. A non-transitory computer-readable medium having instructions stored thereon for programming a processor to perform steps of:
    obtaining data from an Erbium-Doped Fiber Amplifier (EDFA) optical amplifier having a plurality of pumps, wherein the data includes a representative optical power in the EDFA optical amplifier and a pump metric representative of a state of the plurality of pumps;
    determining an efficiency metric based on the representative optical power and the pump metric representative of the state of the plurality of pumps;
    determining a degradation in operation of the EDFA optical amplifier based on the efficiency metric; and
    causing one or more actions based on a determination of the degradation,
    wherein the representative optical power is $P_{out} - P_{in}$ where $P_{out}$ is the output power of the EDFA optical amplifier including Amplified Stimulated Emission (ASE) and $P_{in}$ is the input power to the EDFA optical amplifier including ASE, wherein the pump metric is $\Sigma_i(I_i-I_{th,i})$ where i is an integer the counts over all of the plurality of pumps, $I_i$ is the current of pump I, and $I_{th,i}$ is the threshold current of pump I, and wherein the efficiency metric is equal to $$\frac{P_{out} - P_{in}}{\Sigma_i (I_i - I_{th,i})}.$$

8. The non-transitory computer-readable medium of claim 1, wherein the instructions stored thereon further program the processor to perform steps of
determining the degradation based on one of i) the efficiency metric reaching a threshold and ii) values of the efficiency metric over time having a negative trend.

9. The non-transitory computer-readable medium of claim 1, wherein the one or more actions include any of
an alert via a Network Management System (NMS) for proactive maintenance, and
a protection switch to another path in a network that does not include the EDFA optical amplifier.

10. The non-transitory computer-readable medium of claim 1, wherein the data includes outputs of a plurality of power monitors and calibration data in memory on the EDFA optical amplifier.

11. The non-transitory computer-readable medium of claim 1, wherein the representative optical power is a linear combination of a selection of a plurality of total input power, total output power, signal output power, and signal input power, and
wherein the pump metric is a linear combination of a selection of a plurality of pump optical powers, pump drive currents, back facet monitor powers, back facet monitor currents, pump monitor powers, and pump monitor currents.

12. The non-transitory computer-readable medium of claim 1, wherein the representative optical power utilizes a transmission coefficient of a Variable Optical Attenuator (VOA) associated with the EDFA optical amplifier.

13. A non-transitory computer-readable medium having instructions stored thereon for programming a processor to perform steps of:
obtaining data from an Erbium-Doped Fiber Amplifier (EDFA) optical amplifier having a plurality of pumps, wherein the data includes a representative optical power in the EDFA optical amplifier and a pump metric representative of a state of the plurality of pumps;
determining an efficiency metric based on the representative optical power and the pump metric representative of the state of the plurality of pumps;
determining a degradation in operation of the EDFA optical amplifier based on the efficiency metric; and
causing one or more actions based on a determination of the degradation,
wherein the representative optical power is $GP_{in}$ where G is the signal gain of the EDFA optical amplifier and $P_{in}$ is the input power to the EDFA optical amplifier including ASE,
wherein the pump metric is $\Sigma_i(P_i)$ where i is an integer the counts over all of the plurality of pumps, and $P_i$ is the optical power of pump i, and
wherein the efficiency metric is equal to $$\eta_{eff} = \frac{GP_{in}}{\Sigma_i (P_i)}.$$

14. The non-transitory computer-readable medium of claim 1, wherein the instructions stored thereon further program the processor to perform steps of
determining the degradation based on one of i) the efficiency metric reaching a threshold and ii) values of the efficiency metric over time having a negative trend.

15. The non-transitory computer-readable medium of claim 1, wherein the one or more actions include any of
an alert via a Network Management System (NMS) for proactive maintenance, and
a protection switch to another path in a network that does not include the EDFA optical amplifier.

16. The non-transitory computer-readable medium of claim 1, wherein the data includes outputs of a plurality of power monitors and calibration data in memory on the EDFA optical amplifier.

17. The non-transitory computer-readable medium of claim 1, wherein the representative optical power is a linear combination of a selection of a plurality of total input power, total output power, signal output power, and signal input power, and
wherein the pump metric is a linear combination of a selection of a plurality of pump optical powers, pump drive currents, back facet monitor powers, back facet monitor currents, pump monitor powers, and pump monitor currents.

18. The non-transitory computer-readable medium of claim 1, wherein the representative optical power utilizes a transmission coefficient of a Variable Optical Attenuator (VOA) associated with the EDFA optical amplifier.

* * * * *